(12) United States Patent  (10) Patent No.: US 7,579,969 B2
Tsividis                                       (45) Date of Patent:    Aug. 25, 2009

(54) SYSTEMS AND METHODS FOR CREATING AND USING A CONDITIONING SIGNAL

(75) Inventor: Yannis Tsividis, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 11/544,095

(22) Filed: Oct. 6, 2006

(65) Prior Publication Data

US 2007/0216466 A1    Sep. 20, 2007

Related U.S. Application Data

(60) Provisional application No. 60/728,677, filed on Oct. 19, 2005.

(51) Int. Cl.
*H03M 1/10* (2006.01)
(52) U.S. Cl. .................. 341/110; 341/144; 341/155
(58) Field of Classification Search .............. 341/110, 341/144, 155
See application file for complete search history.

(56) References Cited

U.S. PATENT DOCUMENTS

| | | | | |
|---|---|---|---|---|
| 4,297,680 | A * | 10/1981 | Koeman | ............ 341/158 |
| 5,424,735 | A * | 6/1995 | Arkas et al. | ............ 341/144 |
| 5,872,531 | A * | 2/1999 | Johnson et al. | ............ 341/144 |
| 5,883,594 | A | 3/1999 | Lau | |
| 5,920,888 | A | 7/1999 | Shirotori et al. | |
| 6,026,288 | A | 2/2000 | Bronner | |
| 6,177,901 | B1 * | 1/2001 | Pan et al. | ............ 341/155 |
| 6,429,799 | B1 * | 8/2002 | Kamas et al. | ............ 341/155 |
| 6,462,693 | B1 * | 10/2002 | Rivoir | ............ 341/155 |
| 6,492,929 | B1 * | 12/2002 | Coffey et al. | ............ 341/155 |
| 6,717,540 | B1 * | 4/2004 | Kamas et al. | ............ 341/155 |

FOREIGN PATENT DOCUMENTS

EP        0810600 B1    7/2002

OTHER PUBLICATIONS

Inose, H. et al., "Asynchronous delta-modulation system," Electronic Letters, vol. 2, Issue 3, Mar. 1966, pp. 95-96.
Tsividis, Y., "Continuous-time digital signal processing," Electronic Letters, vol. 39, Issue 21, Oct. 16, 2003, pp. 1551-1552.
Tsividis, Y. et al., "Digital signal processing in continuous time: a possibility for avoiding aliasing and reducing quantization error," in Proceedings of the IEEE International Conference on Acoustics, Speech and Signal Processing (ICASSP '04), vol. 2, pp. 589-592, Montreal, Canada, May 2004.

* cited by examiner

*Primary Examiner*—Howard Williams
(74) *Attorney, Agent, or Firm*—Wilmer Cutler Pickering Hale and Dorr LLP (57) ABSTRACT

Systems and methods for creating and using a conditioning signal are provided. In some embodiments, systems for creating a conditioning signal providing information regarding an input signal are provided, wherein the systems comprise: a signal conditioning developer that receives the input signal and produces the conditioning signal; a delay device that receives the input signal and produces a delayed input signal, wherein the delayed input signal is delayed to simultaneously transmit with the conditioning signal and form a vector signal with the delayed input signal and the conditioning signal; and a receiving circuit coupled to the signal conditioning developer and the delay device that receives the vector signal and dynamically adjusts according to the conditioning signal.

15 Claims, 7 Drawing Sheets

SYSTEMS AND METHODS FOR CREATING AND USING A CONDITIONING SIGNAL

CROSS-REFERENCE TO RELATED APPLICATIONS

This application claims benefit of U.S. Provisional Patent Application No. 60/728,677, filed Oct. 19, 2005, which is hereby incorporated by reference herein in its entirety.

TECHNICAL FIELD

The disclosed subject matter relates to systems and methods for creating and using a conditioning signal.

BACKGROUND

Signals are widely used to represent and carry information. Signals are typically propagated in a medium, such as an electrical charge in a wire or radio waves in the air. Signals generally come in two forms, digital signals and analog signals. Digital signals are discrete and quantized, while analog signals are continuous. Both of these types of signals may be modified by using devices such as amplifiers, filters, and signal processors. These devices can change the amplitude of a signal or some frequencies of a signal. Devices such as analog-to-digital (A/D) converters and digital-to-analog (D/A) converters change a signal from being analog to digital and vice versa. Typically, to perform this conversion, the signal is measured at time instants, which is usually referred to as sampling, and then assigned a discrete value after a comparison is performed.

SUMMARY

The disclosed subject matter relates to systems and methods for creating and using a conditioning signal. In some embodiments, systems for creating a conditioning signal providing information regarding an input signal are provided, wherein the systems comprise: a signal conditioning developer that receives the input signal and produces the conditioning signal; a delay device that receives the input signal and produces a delayed input signal, wherein the delayed input signal is delayed to simultaneously transmit with the conditioning signal and form a vector signal with the delayed input signal and the conditioning signal; and a receiving circuit coupled to the signal conditioning developer and the delay device that receives the vector signal and dynamically adjusts according to the conditioning signal.

In some embodiments, methods for creating and using a conditioning signal providing information regarding an input signal are provided, wherein the methods comprise: deriving from an input signal a conditioning signal that contains information regarding how a receiving circuit is to handle the input signal; delaying the input signal to synchronize the input signal with the conditioning signal where a delayed input signal and the conditioning signal form a vector signal; transmitting the vector signal to the receiving circuit; and adjusting the receiving circuit dynamically according to the conditioning signal.

In some embodiments, systems for creating and using a conditioning signal providing information regarding an input signal are provided, wherein the systems comprise: a means for providing a signal conditioning developer that receives the input signal and produces the conditioning signal; a means for providing a delay that receives the input signal and produces a delayed input signal that is delayed to simultaneously transmit with the conditioning signal and form a vector signal with the delayed input signal and the conditioning signal; and a means for providing a receiving circuit coupled to the means for providing a signal conditioning developer and the means for providing a delay device that receives the vector signal and dynamically adjusts according to the conditioning signal.

In some embodiments, systems for creating and using a conditioning signal providing information regarding an input signal are provided, wherein the systems comprise: a signal conditioning developer that receives the input signal and produces the conditioning signal that is transmitted simultaneously with the input signal to form a vector signal; and a receiving circuit coupled to the signal conditioning developer that receives the vector signal and dynamically adjusts according to the conditioning signal.

DETAILED DESCRIPTION

Systems and methods for creating a conditioning signal are provided. In some embodiments, a conditioning signal is created from an input signal and possibly other information, such as preset settings or system variables. The conditioning signal can provide information relating to this input signal to a circuit so that a circuit receiving the conditioning signal can dynamically adapt to the input signal. The conditioning signal can be used to provide a variety of information about the input signal such as necessary range to accommodate the signal, the acceptable distortion level for the signal, and the tolerance of the signal to noise.

Figure 5:
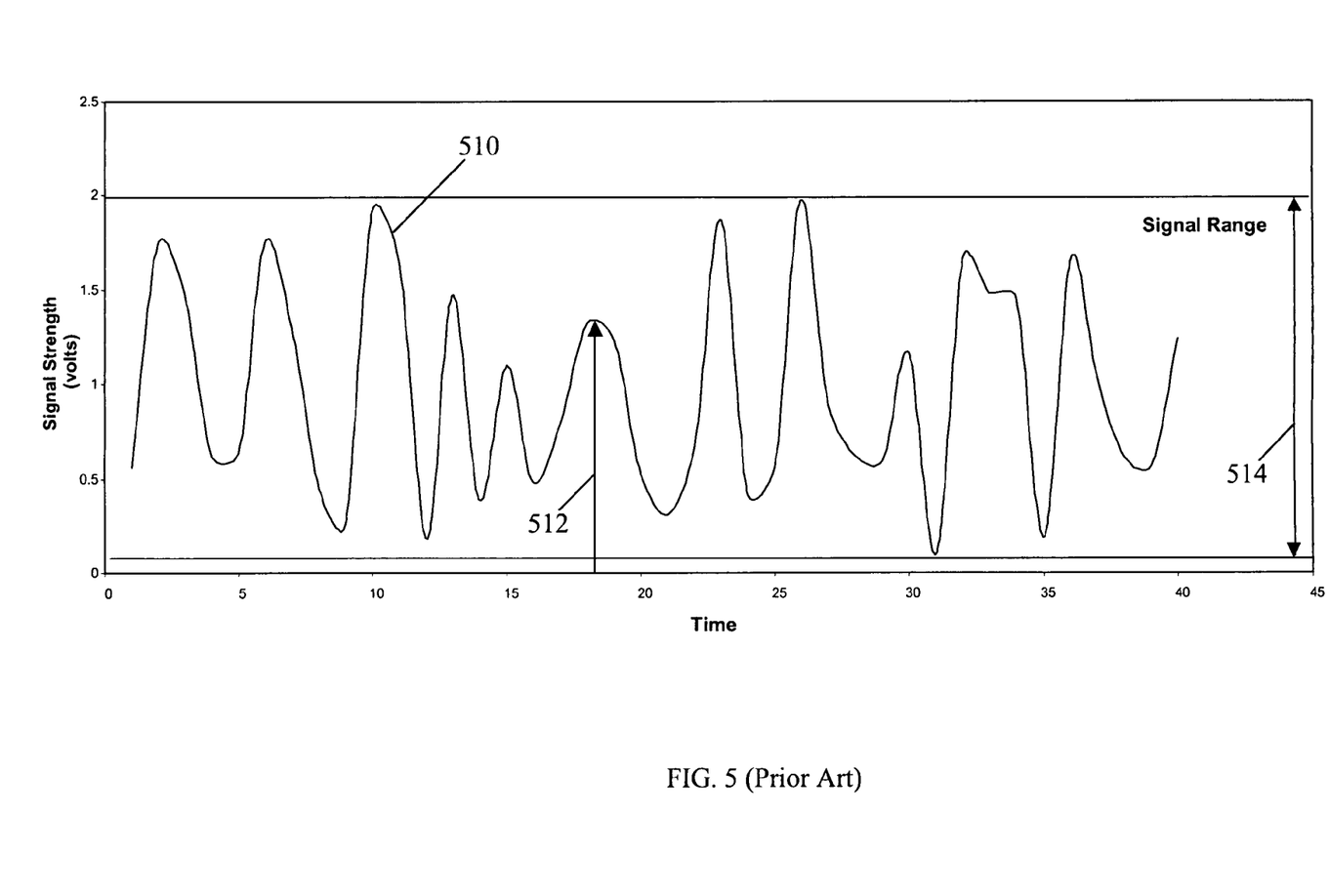
FIG. 5 is an illustration of a signal range in accordance with some embodiments of the disclosed subject matter.

Signal processors and circuits are typically designed to accommodate a range of signals expected plus some safety factor. Many times, a difficulty arises in designing a circuit to both function over the expected range and to remain precise when handling signals that operate within a fraction of the expected range. FIG. 5 is an illustration of a signal range 514. Signal 510 varies in voltage over time, but is typically between 0.1 volt and 2 volts. Circuits that are designed to process signal 510 may need to handle a signal range from 0 volts to 2 volts in order to avoid distortion or loss of information. The circuits may be over-designed as far as processing of other, less demanding signals—for example, a signal whose range is 0.5 volts to 1.5 volts, are concerned. The circuits can also be over-designed with respect to one parameter, but sacrifice performance in terms of another parameter. For example, to provide a circuit whose range is 0 volts to 2 volts, the circuit's signal-to-noise ratio may be degraded over a frequency range such as 100 Hz to 1.5 KHz. In general, circuits cannot be designed optimally for all the types of signals that can be received.

A solution to this problem, in some embodiments, is to provide a conditioning signal with the input signal. This conditioning signal, which synchronously accompanies the input signal, provides information regarding how the input signal can be processed. Further, the conditioning signal can specify how the circuit is to handle the signal (i.e., the circuit may be conditioned for some levels of performance). For example, the conditioning signal can provide information such as an amplitude 512 or an signal range 514 of signal 510 to the receiving circuit. This information from the conditioning signal can be used to dynamically establish a point of operation in the circuit for achieving some types of conditions such as setting the amount of power dissipated, the tolerance for noise in the signal, the desired frequency response, and/or the tolerance for distortion. The conditioning signal can also contain instructions regarding what level of service the circuit should maintain for some types of conditions.

Figure 6A:
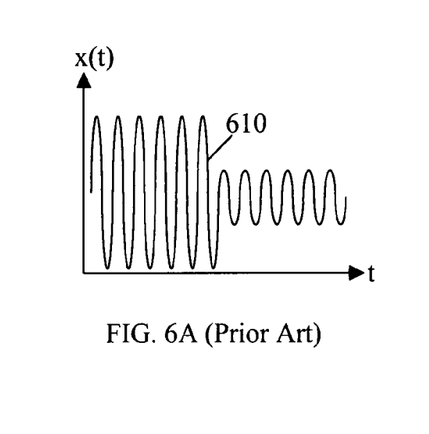
FIG. 6A is an illustration of a signal.
Figure 6B:
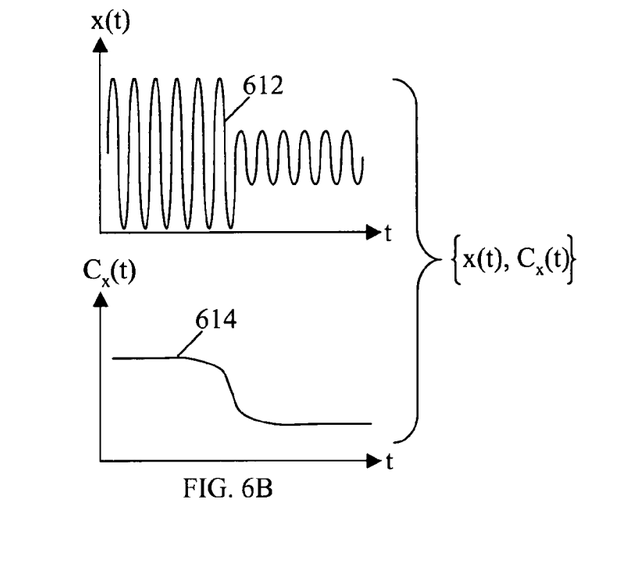
FIG. 6B is an illustration of a signal and a conditioning signal, together forming a vector in accordance with some embodiments of the disclosed subject matter.

A classical representation of a signal 610 x(t) is illustrated in FIG. 6A. Signal 610 x(t) has a value that can vary as a function of time. FIG. 6B illustrates a signal 612 and a conditioning signal 614 in accordance with some embodiments of the disclosed subject matter. Signal 612 and conditioning signal 614 are represented by a pair $\{x(t), C_x(t)\}$ as a vector signal. In some embodiments, $C_x(t)$ is the envelope of x(t), and the envelope is used for the purposes of resizing a signal so that the signal's envelop is compressed or expanded in the dynamic range. Conditioning signal 614 $C_x(t)$ can also be used to adjust a receiving circuit for the purposes of dynamic biasing for low power and low noise. An example of dynamic biasing is adjusting a DC bias level voltage in an amplifier to reduce power dissipation, while avoiding signal clipping or other forms of distortion from degrading signal 612. In other embodiments, conditioning signal 614 can carry information relating to the acceptable distortion level, or the needed driving ability. An example of an acceptable distortion level can be in a telephony system where the acceptable distortion level is set to the worst level acceptable for a call. By conditioning other components to process a signal allowing for the acceptable level of distortion, so that the call is within the acceptable distortion level when received, one can ensure the signal is not over-processed.

Figure 1:
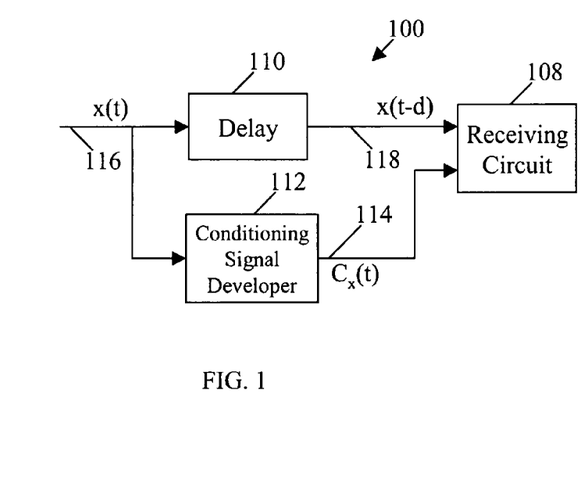
FIG. 1 is a schematic diagram of a signal developer in accordance with some embodiments of the disclosed subject matter.

FIG. 1 is a schematic diagram of a signal developer 100 in accordance with some embodiments of the disclosed subject matter. Signal developer 100 includes a receiving circuit 108, delay circuit 110, and a conditioning signal developer 112. When generating a conditioning signal 114, $C_x(t)$, from a signal 116, x(t), a delay is added by delay circuit 110 to account for time spent processing or otherwise analyzing signal 116 in conditioning signal developer 112. Delay is added to signal 116 to keep delayed signal 118 and conditioning signal 114 synchronized. In some embodiments, the delay added may be negligible or zero, in which case the delay circuit 110 can be omitted. Receiving circuit 108 receives conditioning signal 114 and delayed signal 118 and uses conditioning signal 114 to adjust the processing of delayed signal 118.

Conditioning signal developer 112 may be implemented using, for example, an envelope detector, a peak detector, an average level detector, or any suitable device that can develop a conditioning signal for the desired application. Additionally, combinations of detectors, such as an envelope detector and an average level detector, can be used in combination to produce a conditioning signal. Delay circuit 110 may be implemented using any suitable mechanism. For example, with analog signals, capacitors may be used to hold an input signal's value for a period of time in an analog-to-digital converter. As another example, with digital signals, an input signal may be stored in a digital delay circuit, such as a digital buffer, register, or memory.

Figure 2:
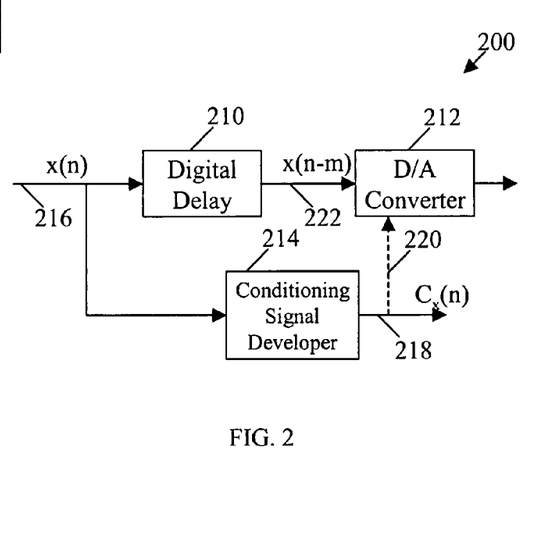
FIG. 2 is a schematic diagram of digital signal conditioning in accordance with some embodiments of the disclosed subject matter.

FIG. 2 is a schematic diagram of a digital signal conditioning circuit 200 in accordance with some embodiments of the disclosed subject matter. Digital signal conditioning circuit 200 includes a digital delay 210, a digital-to-analog (D/A) converter 212, and conditioning signal developer 214. A digital input signal 216 x(n) is used by conditioning signal developer 214 to develop conditioning signal 218 $C_x(n)$. The conditioning signal 218, in some embodiments, can be provided to D/A converter 212 by line 220 to condition the converter for handling delayed signal 222. Conditioning signal 218 can also be provided as a digital signal in some embodiments to external devices such as digital signal processors. If the conditioning signal 218 $C_x(n)$ and delayed signal 222 x(t-d) are represented by a pair as a digital vector signal, the conditioning information $C_x(n)$ can be stored with the delayed signal 222 x(n-m).

When a signal, such as 216, is being processed by conditioning signal developer 214, in some embodiments, present, past, and future values of signal 216 are used to determine information regarding signal 216. A reproduction engine, for example, D/A converter 212 when connected with line 220, can be used to interpret conditioning signal 218. The reproduction engine can use a pre-determined standard, in some embodiments, to modify delayed signal 222. In some embodiments, the delay and the conditioning signal developer can be under software control or implemented in software.

Figure 3:
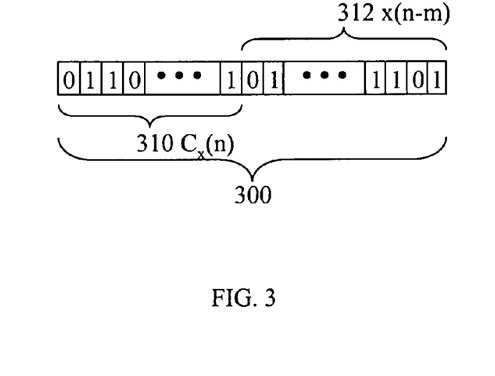
FIG. 3 is an illustration of a stored word in accordance with some embodiments of the disclosed subject matter.

FIG. 3 illustrates a digital stored pair 300 in accordance with some embodiments of the disclosed subject matter. Stored pair 300 includes conditioning signal information 310 and signal information 312. Conditioning signal information 310 is interspersed with signal information 312, and is provided as a header to signal information 312, in some embodiments. Conditioning signal information 310 and signal information 312 can be stored together on a CD, DVD, a magnetic film, flash memory, or any computer readable medium. For example, on a CD, with a digital word, a number of bits may be used for signal information 312 x(n-m), and a number of bits may be used for conditioning signal information 310 $C_x(n)$.

The signal information 312 part of stored pair 300 is "what to handle" the conditioning signal information 310 part of stored pair 300 is "how to handle." In some embodiments, the conditioning signal $C_x$ can be used as a signal to prepare the circuit for upcoming input signal values. Since both conditioning signal information 310 and signal 312 are in stored pair 300, conditioning signal information 310 can be accessed in conjunction with reading signal information 312 and the two can be re-aligned properly in time so that the conditioning information 310 can be in conjunction with signal information 312.

In another example, conditioning signal information 310 $C_x(n)$ can include information that specifies how many bits are used to form signal information 312 x(n-m). In some embodiments, conditioning signal information 310 $C_x(n)$ can be used to dynamically alter the precision at which a signal is quantized. This may be accomplished by changing the level lines with respect to the signal so that precise measurements can be taken over the range of the signal. This will be explained in more detail below in connection with digitizing.

Figure 4:
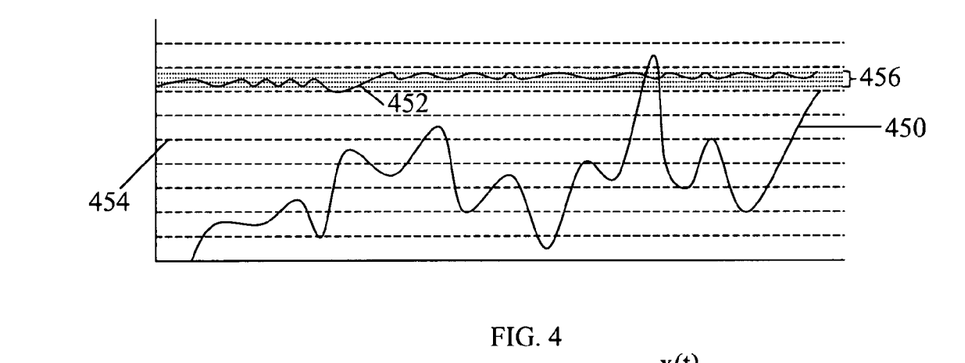
FIG. 4 is an illustration of digitizing in accordance with some embodiments of the disclosed subject matter.

FIG. 4 illustrates conditioning signaling in combination with digitizing in accordance with some embodiments of the disclosed subject matter. Input signal 450 shows a signal that can be digitized with a greater degree of precision compared to input signal 452 when level lines 454 are used for digitizing. A conditioning signal can be used with input signal 452, for example, to resize the signal envelope while the signal is being digitized by a digitizer or dynamically change the digitizer to quantize input signal 452 more precisely. This is shown in FIG. 4 by additional level lines 456. In some embodiments, amplitude digitizing can be used. Amplitude digitizing is signal quantization that uses level line thresholds and the time crossed to digitally represent a signal, and is further described in US Patent Publication No. 20040263375, entitled "Continuous-Time Digital Signal Generation, Transmission, Storage and Processing," which is hereby incorporated by reference herein in its entirety.

The described embodiment quantizes and digitizes an input analog signal without sampling, so as to produce a continuous-time digital signal. This continuous-time digital signal is a function of continuous time, such that a set of pairs, e.g., $(t_i, x_i)$ completely describes the continuous-time digital signal (where $x_i$ represents the amplitude value, and $t_i$ represents the time at which that amplitude value was reached). Since the amplitude levels are known, a type of delta modulation signal may also be used. In some embodiments, the quantized and digitized information related to the input analog signal is stored in a memory medium (such as magnetic tape or some other continuous-time storage medium) and may be later transmitted, and/or processed as described herein.

Note that in addition to quantizing and digitizing the amplitude information related to the input analog signal, the timing information related to when quantized and digitized amplitude information changes states can also be stored on storage media, along with the associated amplitude information. Note also that this stored information does not need to be processed as described herein; the generation, storage and/or transmission of the quantized and digitized continuous-time signal has utility in and of itself.

Figure 7:
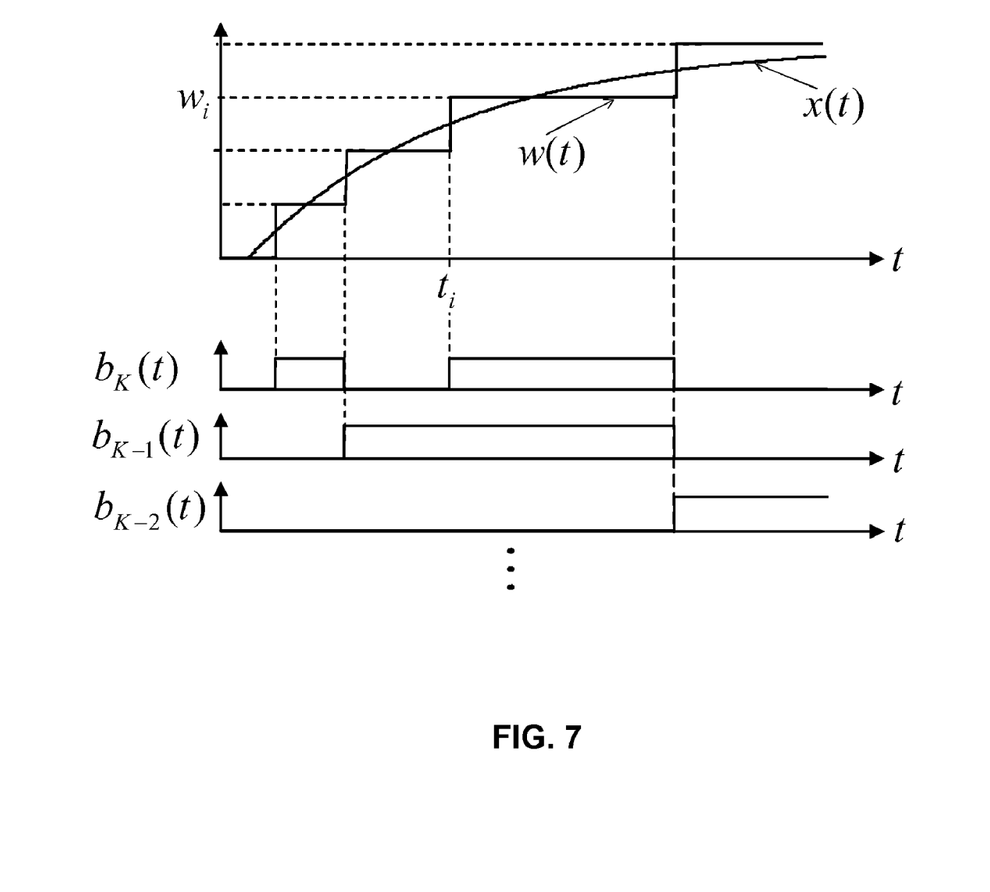
FIG. 7 shows one way of representing an input analog signal with a quantized and digitized continuous-time signal.

FIG. 7 shows one way of representing an input analog signal x(t) with a quantized continuous-time signal w(t). In this embodiment, the continuous-time bit waveforms that form w(t) are shown below x(t) and w(t), where $b_K$ represents the least significant bit of the continuous-time digital signal. Although FIG. 7 shows only three bits in the continuous-time digital signal, it is understood that the digitized continuous-time signal w(t) may include any number of bits. Other embodiments for representing an input analog signal with a quantized and digitized continuous-time signal may also be used. It is emphasized that what is different here from the prior art is that the bit waveforms are continuous-time ones. This is to be distinguished from the standard representation using discrete-time digital signals The continuous-time digital signal may be processed by a continuous-time ADC/DSP/DAC (Analog to Digital Converter/Digital Signal Processor/Digital to Analog Converter) that delays each bit of the continuous-time digital signal with one or more continuous-time delay lines. Since the bits of the continuous-time digital signal do not derive from periodic sampling, each bit remains a function of continuous-time. The DSP then multiplies the delayed bits by filtering coefficients, and forms a binary-weighted sum of the multiplication products. The resulting sum is a filtered version of the continuous-time digital signal, where the coefficients define the filter transfer function.

Figure 8:
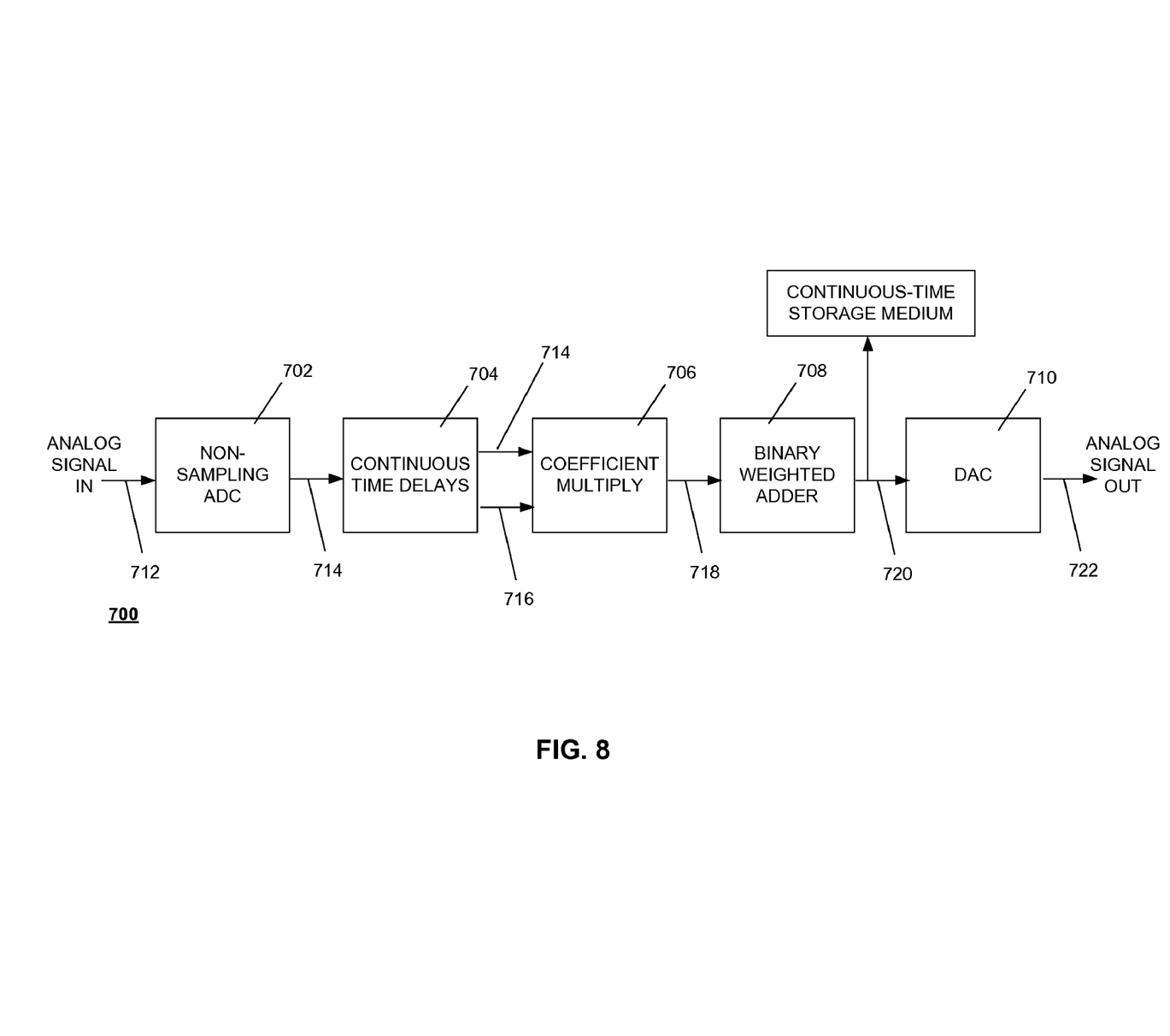
FIG. 8 is a block diagram of a continuous-time DSP.

FIG. 8 is a block diagram of a continuous-time ADC/DSP/DAC 700, including a non-sampling ADC 702, a continuous-time delay 704, a coefficient multiplier 706, a binary-weighted adder 708, and a DAC 710. In general, the ADC 702 receives an analog signal 712, and produces a sequence of discrete amplitude values 714 that is a continuous-time digital version of the analog signal. In one embodiment, the non-sampling ADC 702 quantizes the input analog signal 712 by comparing the input signal 712 to 16 discrete reference voltage levels, and setting the continuous-time digital signal 714 to a digital value that corresponds to a particular reference voltage level whenever the input level equals or exceeds that reference voltage level. Other types of non-sampling quantization known in the art may also be used.

Although shown in FIG. 8 as a single line, the continuous-time digital signal 714 is actually a digital word having a most significant bit, a least significant bit, and a word width, as described in more detail later.

The continuous-time delay 704 receives the continuous-time digital signal 714 from the ADC 702 and forwards a delayed version 716 of the continuous-time digital signal 714 along with the original continuous-time digital signal 714 to the coefficient multiplier 706.

The coefficient multiplier 706 multiplies the continuous-time digital signal 714 with one coefficient, and multiplies the delayed version 716 by another coefficient. These coefficients correspond to a transfer function, and are described in more detail below. The binary-weighted adder 708 combines the products 718 of the coefficients and the delayed/undelayed continuous-time digital signal as a weighted summation with respect to relative significance of the bits within those products 718.

The DAC 710 receives the weighted sum 120 and produces an analog output signal 722 therefrom.

Figure 9:
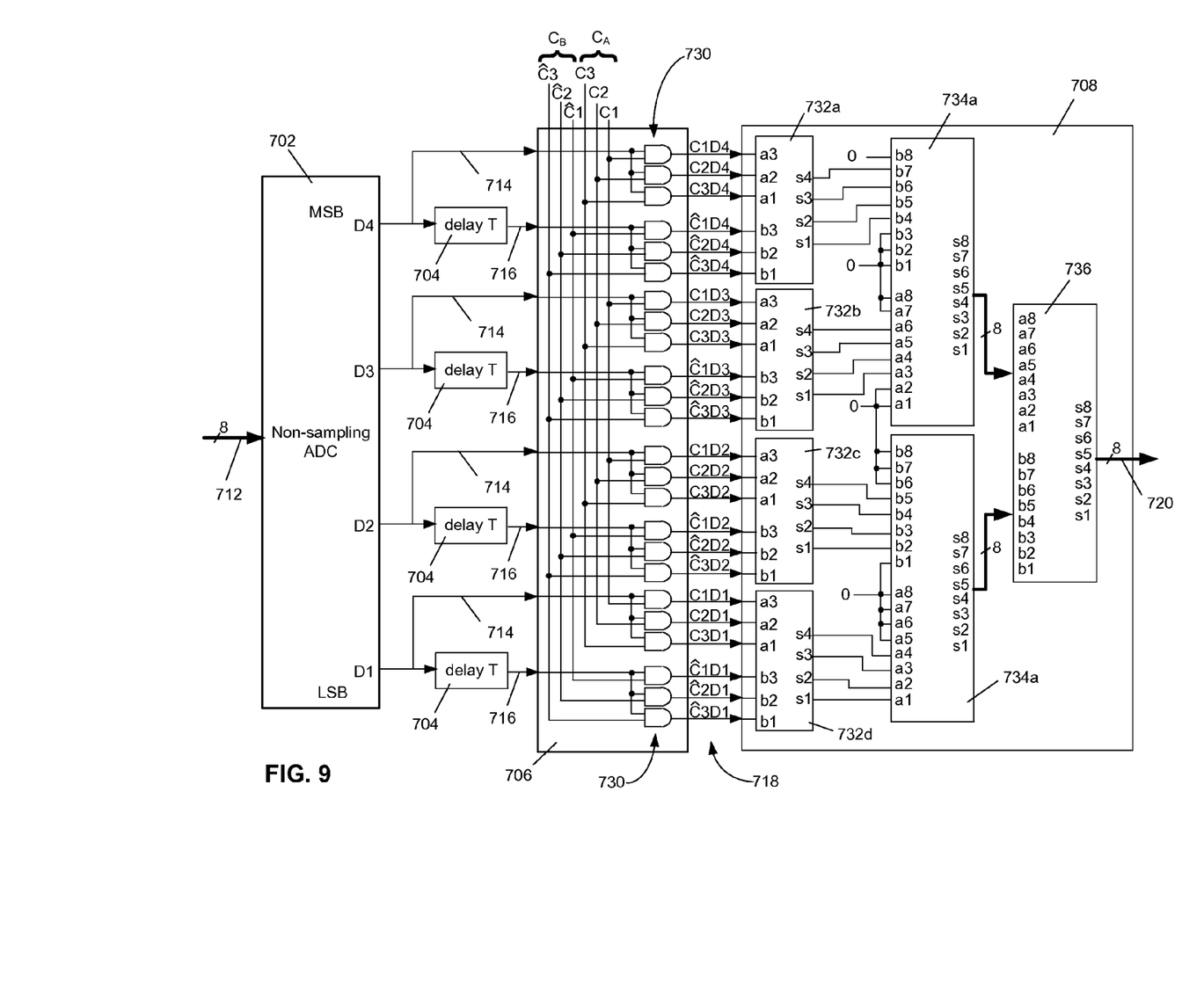
FIG. 9 is a more detailed view of the continuous-time DSP shown in FIG. 8.

FIG. 9 is a more detailed view of one possible implementation of the continuous-time DSP 700 shown in FIG. 8. The non-sampling ADC 702 quantizes the input analog signal 712 and produces a continuous-time digital signal 714 represented by a four-bit word, i.e., with 16-level quantization. Such an ADC can be implemented, for example, using a conventional "flash" architecture, in which an array of comparators compares the input signal to quantization level values. The outputs of the comparator can be fed into encoding logic, to produce the required bit values at the output of the ADC, without using any clock and latches, in order to ensure continuous-time operation. While the code used in the present example is a straight-forward one, it is to be understood that other well-known digital codes can be employed as well, with associated well-known advantages.

A continuous-time delay 704 delays each bit of the continuous-time digital signal 714 by a time period T. In this embodiment, each of the continuous-time delays 704 is a cascade of logic inverters, some or all coupled with load capacitances matched to their current drive capability to produce an appropriately slow switching time. Other continuous-time delay techniques known in the art may also be used for the delays 704. The delay such structures provide can be set to a precise value by making their current drive capability adjustable and locking their responses to an external clock, using standard techniques know in the art. Note that a clock used for this purpose does not affect the continuous-time nature of the signal flow through the DSP 700, and this is the only way the DSP 700 uses a clock. In other words, a clock used to set the delay lines to a precise delay value is not related to sampling in any way.

The coefficient multiplier 706 then multiplies the continuous-time digital signal 714 by coefficient $C_A$, and multiplies the delayed version 716 of the continuous-time digital signal 714 by coefficient $C_B$. In this embodiment, the "multiplication" is not true arithmetic multiplication, but is rather gating via AND gates 730. The coefficient $C_A$ includes three bits, $C_1$, $C_2$ and $C_3$. The coefficient $C_B$ includes three bits $\hat{C}_1$, $\hat{C}_2$ and $\hat{C}_3$. Thus, for each bit from the ADC 702, the multiplier 706 produces six bits of product data 118. For example, D4, the most significant bit (MSB) from the ADC 702 results in $C_1 \cdot D4$, $C_1 \cdot D4$, $C_1 \cdot D4$, $\hat{C}_1 \cdot D^2 4$, $\hat{C}_2 \cdot D^2 4$ and $\hat{C}_3 \cdot D^2 4$, where D4 is the un-delayed continuous-time digital signal 714, and $D^2 4$ is the delayed D4 716.

The binary-weighted adder 708 sums the resulting 24 bits of product data 718 via three summing stages. The first summing stage includes a set of four-bit adders 732a, 732b, 732c and 732d, each of which adds the delayed products to the un-delayed products for a particular bit to produce an intermediate sum. Note that although not shown in FIG. 9, the most significant input for each set of four-bit inputs to the adders 132 is held fixed at logic zero.

The second stage includes two eight-bit adders 734a and 734b, each of which adds the intermediate sum for two of the bit paths from the ADC 702. This second stage accounts for the decreasing bit significance from the most significant bit path to the least significant bit path by increasingly padding logic zeros in the higher significant bits of the adder inputs. This padding produces the "binary weighting" described herein. For the D4 bit path, adder 734a has a logic zero at input b8, and uses bits b4 through b7 to receive the intermediate sum bits. For the D3 bit path, adder 734a has logic zeros at inputs a7 and a8, and uses bits a3 through a6 to receive the intermediate sum bits. For the D2 path, adder 734b has logic zeros at inputs b6 through b8, and uses bits b2 through b5 to receive the intermediate sum bits. For the D1 path, adder 734b has logic zeros at input bits a5 through a8, and uses bits a1 through a4 to receive the intermediate sum bits. Note also that all unused lower bits on adders 734a and 734b are set to logic zero.

The third summing stage includes a single eight-bit adder 736 that adds the outputs from the adders 734a and 734b to produce the weighted sum 720. Although not shown in FIG. 9, the weighted sum 720 is subsequently converted to an analog signal via a digital to analog conversion process, i.e., as with the DAC 710 shown in FIG. 8. It is to be understood that the adder implementation is only used as an example. In high-speed applications, adder implementation should possibly take into account the nonzero propagation delays in the logic gates, and consider the delays of the various paths so that "isochronic forks" are implemented to ensure that bits to be added change their value at the same time.

The embodiment shown in FIG. 9 uses a four-bit digital signal and employs only two coefficients as an example for the sake of simplicity. In general, the concepts this embodiment represents can readily be extended to more bits and more coefficients. In addition, although for simplicity above we have presented the technique using for an example a non-recursive structure, the technique described can be implemented also in recursive form, where there is feedback such that the output of the DSP is processed in a manner similar to that above and is fed back to an internal point in the processor. Several other topologies commonly used in signal processors, as described, for example, in A. V. Oppenheim and R. W. Schafer, "Discrete-Time Signal Processing," Prentice-Hall, 1989 and elsewhere in the relevant technical literature, can also be used with this technique. Further, the specific components of this embodiment (i.e., the multiplier, the adder, the continuous-time delay, etc.) can all be implemented via other techniques known in the art, including optical ones. We will describe other more general embodiments later in this description, although no particular embodiment is mean to limit the concepts described herein The transfer function corresponding to each of N tap delays (where N in the example above is 2) is $e^{-sT}$, where s is the Laplace transform variable and T is the continuous-time delay between taps. Thus, in the case of integer n, each continuous-time bit is processed by a transfer function of the form:

$$H(e^{sT}) = \sum_{n=0}^{N} c_n e^{-nsT} \qquad (1)$$

The continuous-time digital signal 714 is represented as a binary-weighted sum of individual bits, each of which is processed by transfer function (1). The binary-weighted sum formed by the adder 708 therefore corresponds to the continuous-time digital signal 714 processed by exactly the same transfer function (1). The transfer function of (1) corresponds to that of classical analog transmission-line filters, and is identical to the corresponding transfer function H(z) of a conventional digital filter.

Substituting $j\omega$ for s in transfer function (1) shows that the frequency response is periodic, with period $2\pi/T$. Since the continuous-time DSP 700 does not use sampling in any form, there is no aliasing in the filtered output, i.e., an input at a frequency $\omega$ produces an output at a frequency $\omega$, regardless of the value of $\omega$.

The continuous-time DSP described herein produces improved quantization noise characteristics as compared to sampling DSP systems because the quantization error of the continuous-time DSP contains only harmonics of the analog input signal. No aliasing of distortion components into the baseband occurs.

Due to the way the ADC 702 quantizes the analog signal, i.e., by generating quantization steps when the input signal crosses reference voltage levels, the step intervals in the quantization signal 714 are short when input analog signal 712 changes rapidly. Even shorter intervals can occur at the output of the binary-weighted adder 708 due to certain input combinations. These short step intervals, alone or combined with glitches caused by the combinatorial hardware, can cause momentary errors in the analog output signal 722. Such errors, however, are significantly different as compared to conventional DSP systems. Such deviations simply mean that the value of the quantization error in the output signal 722 changes somewhat, similar to the way noise and distortion in analog system vary depending on transient changes in system parameters. For the continuous-time DSP system described herein, the momentary errors in the analog output signal 722 are periodic when the input analog signal is periodic since there is no sampling. The noise spectra due to these errors occur at harmonic frequencies of the input, changing only the harmonic distortion of the output signal 722. Such momentary errors do not have a lasting effect on the output signal 722 because the DSP 700 does not use components with memory. The errors contribute little to the total mean square error of the output signal 722, precisely because they last only a short time and because much of the energy they contribute is out of band.

Although the embodiment described in FIGS. 8 and 9 is a hardware implementation, the concepts of that embodiment can also be implemented via software executing by a processor. These concepts can also be implemented in a recursive structure, in either hardware or software.

Figure 10:
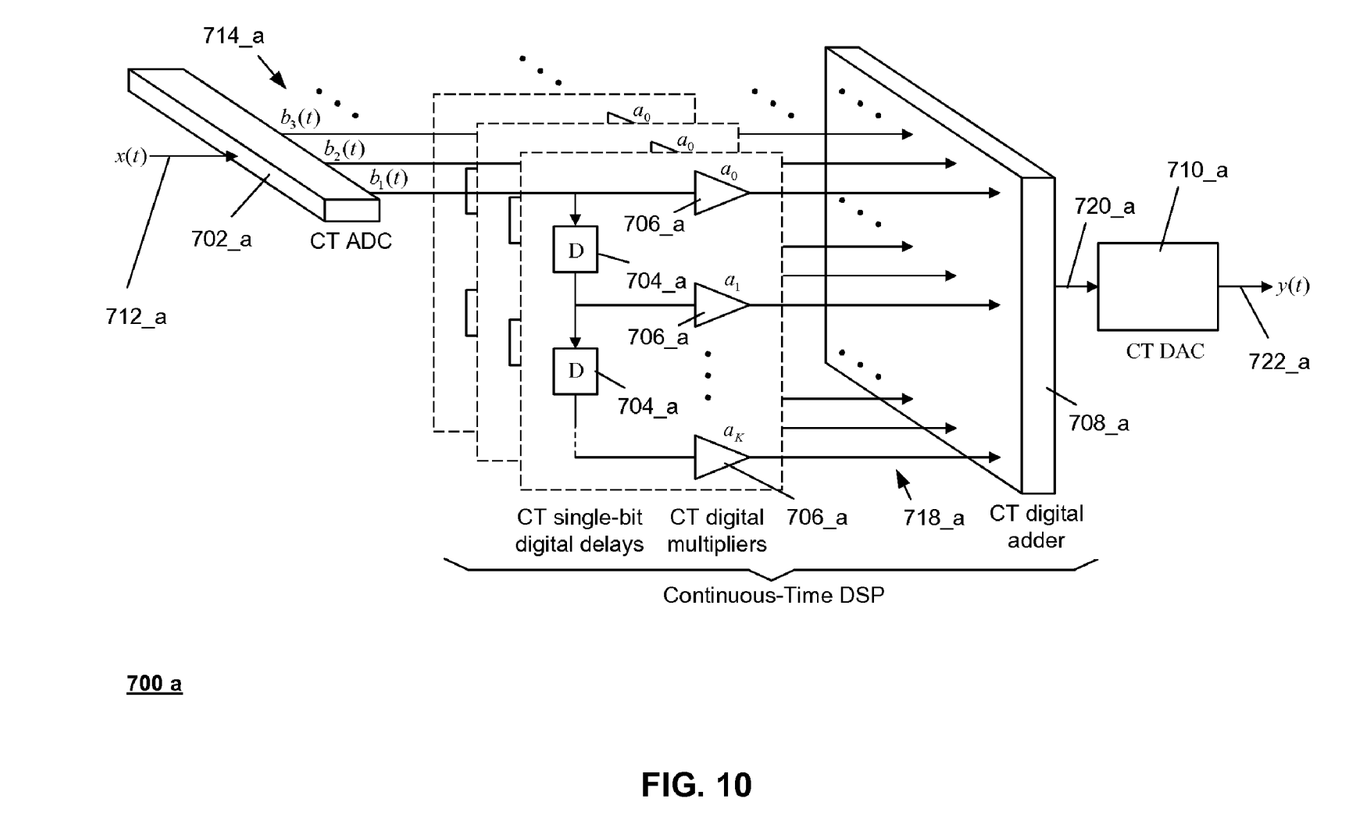
FIG. 10 shows a general representation of the continuous-time DSP embodiment of FIG. 8.

FIG. 10 shows a general representation of the continuous-time DSP described herein. In this figure, CT means continuous-time, D represents a continuous-time delay block, and $a_n$ represents a coefficient multiplication. FIG. 10 adds an "_a" suffix to the reference numbers from corresponding components in FIG. 8 to highlight the relationship between components in the two figures. As described herein, and as represented in FIG. 10 by broken lines and multiple dots ( . . . ), the continuous-time digital signal may include any number of bits, and the processor may use any number of delays and coefficients.

The conditioning signal information can be used to provide a quantized representation that is uses 16 bits, but gives a quantized precision of a 24-bit digitizer, for example. This representation can be stored on a computer readable medium such as a CD or DVD. The conditioning signal information can be used when processing the signal for use, such as playing a song. Input signal 452 can be re-constituted by using the conditioning signal information along with the digitized signal in, for example, the circuitry of a CD player.

Typically, in CDs, low-amplitude signals are stored using only a few bits because like signal 452, these low-amplitude signals are not resolved well and experience quantization error. In some embodiments, conditioning signal information can be used to more precisely measure input signal 452, and the conditioning signal can store information for the receiving circuit to reconstitute input signal 452 from the stored bits which are altered to more precisely measure the signal.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter, which is limited only by the claims which follow.

What is claimed is:

1. A system for creating and using a conditioning signal providing information regarding an analog input signal comprising:
   a signal conditioning developer that receives the analog input signal and produces the conditioning signal;
   a delay device that receives the analog input signal and produces a delayed input signal, wherein the delayed input signal is delayed to simultaneously transmit with the conditioning signal; and
   an amplitude digitizer coupled to the signal conditioning developer and the delay device, the amplitude digitizer being configured to receive the delayed input signal and the conditioning signal and to quantize the delayed input signal, wherein the amplitude digitizer uses level line thresholds and times at which the level line thresholds are crossed to digitally represent the delayed input signal.

2. The system of claim 1, wherein the conditioning signal includes information relating to at least one of acceptable distortion level and bias, and the amplitude digitizer dynamically adjusts the at least one of acceptable distortion level and bias according to the conditioning signal information.

3. The system of claim 1, further comprising a computer readable medium storing a digital signal vector comprising the delayed input signal and the conditioning signal.

4. The system of claim 1, wherein the amplitude digitizer quantizes the delayed input signal based on information provided by the conditioning signal.

5. The system of claim 4, further comprising a computer readable medium storing a digitized vector signal comprising a delayed input signal that was digitized using the conditioning signal and a digitized conditioning signal.

6. A method for creating and using a conditioning signal providing information regarding an analog input signal comprising:
   deriving from an analog input signal a conditioning signal that contains information regarding how a receiving circuit is to handle the analog input signal;
   delaying the analog input signal producing a delayed input signal to synchronize the analog input signal with the conditioning signal;
   receiving the conditioning signal and the delayed input signal at an amplitude digitizer; and
   quantizing the delayed input signal using level line thresholds and times at which the level line thresholds are crossed to digitally represent the delayed input signal.

7. The method of claim 6, wherein the conditioning signal includes information relating to at least one of acceptable distortion level and bias, and the amplitude digitizer dynamically adjusts the at least one of acceptable distortion level and bias according to the conditioning signal information.

8. The method of claim 6, further comprising storing a digital signal vector pair in a computer readable medium comprising the delayed input signal and the conditioning signal.

9. The method of claim 6, wherein the quantizing of the delayed input signal using amplitude digitizing is based on information provided by the conditioning signal.

10. The method of claim 9, further comprising quantizing the input signal using amplitude digitizing and storing a digitized vector signal comprising a delayed input signal that was digitized using the conditioning signal and a digitized conditioning signal.

11. A system for creating and using a conditioning signal providing information regarding an analog input signal comprising:
    a means for receiving the analog input signal and producing the conditioning signal;
    a means for delaying the analog input signal and producing a delayed input signal that is delayed to simultaneously transmit with the conditioning signal; and
    a means for amplitude digitizing coupled to the means for receiving and the means for delaying that receives the delayed input signal and the conditioning signal and the means for amplitude digitizing quantizes the delayed input signal, wherein the means for amplitude digitizing uses level line thresholds and times at which the level line thresholds are crossed to digitally represent the delayed input signal.

12. The system of claim 11, wherein the conditioning signal includes information relating to at least one of acceptable distortion level and bias, and the means for amplitude digitizing dynamically adjusts the at least one of acceptable distortion level and bias according to the conditioning signal information.

13. The system of claim 11, further comprising a means for storing a digital signal vector comprising the delayed input signal and the conditioning signal.

14. The system of claim 11, wherein the means for amplitude digitizing quantizes the delayed input signal based on information provided by the conditioning signal.

15. The system of claim 14, further comprising a means for storing a digitized vector signal comprising a delayed input signal that was digitized using the conditioning signal and a digitized conditioning signal.

* * * * *